US008421373B2

(12) United States Patent
Chung et al.

(10) Patent No.: US 8,421,373 B2
(45) Date of Patent: Apr. 16, 2013

(54) LIGHT-MIXING MULTICHIP PACKAGE STRUCTURE

(75) Inventors: Chia-Tin Chung, Miaoli County (TW); Shih-Neng Dai, Taoyuan County (TW); Chao-Chin Wu, Taipei (TW)

(73) Assignee: Paragon Semiconductor Lighting Technology Co., Ltd., Taoyuan County (TW)

( * ) Notice: Subject to any disclaimer, the term of this patent is extended or adjusted under 35 U.S.C. 154(b) by 237 days.

(21) Appl. No.: 13/069,276

(22) Filed: Mar. 22, 2011

(65) Prior Publication Data
US 2012/0187865 A1  Jul. 26, 2012

(30) Foreign Application Priority Data

Jan. 26, 2011 (TW) .............................. 100102836 A

(51) Int. Cl.
*H05B 37/02* (2006.01)
(52) U.S. Cl.
USPC ........... 315/294; 315/312; 313/509; 313/512; 362/231
(58) Field of Classification Search .................. 315/291, 315/294, 312; 313/506, 509, 512; 362/231
See application file for complete search history.

(56) References Cited

U.S. PATENT DOCUMENTS

| 6,340,824 | B1 * | 1/2002 | Komoto et al. | 257/99 |
| 8,018,151 | B2 * | 9/2011 | Chung et al. | 313/506 |
| 8,217,404 | B2 * | 7/2012 | Wu et al. | 257/88 |
| 2012/0097997 | A1 * | 4/2012 | Chung et al. | 257/89 |
| 2012/0268929 | A1 * | 10/2012 | Chung et al. | 362/231 |

* cited by examiner

*Primary Examiner* — Jason M Crawford
(74) *Attorney, Agent, or Firm* — Li & Cai Intellectual Property (USA) Office

(57) ABSTRACT

A light-mixing multichip package structure includes a substrate unit, a light-emitting unit, a frame unit, and a package unit. The light-emitting unit includes at least one first light-emitting module with red light-emitting chips and at least one second light-emitting module with blue light-emitting chips. The frame unit includes at least one first continuous colloid frame and at least one second continuous colloid frame respectively surrounding the first light-emitting module and the second light-emitting module. The package unit includes a transparent colloid body and a phosphor colloid body respectively covering the first light-emitting module and the second light-emitting module. Hence, when the red light source generated by matching the red light-emitting chips and the transparent colloid body and the white light source generated by matching the blue light-emitting chips and the phosphor colloid body are mixed with each other, the CRI of the light-mixing multichip package structure can be increased.

20 Claims, 9 Drawing Sheets

LIGHT-MIXING MULTICHIP PACKAGE STRUCTURE

BACKGROUND OF THE INVENTION

1. Field of the Invention

The instant disclosure relates to a light-mixing multichip package structure, and more particularly, to a light-mixing multichip package structure for increasing CRI (Color render index).

2. Description of Related Art

The invention of the lamp greatly changed the style of building construction and the living style of human beings, allowing people to work during the night. Traditional lighting devices such as lamps that adopt incandescent bulbs, fluorescent bulbs, or power-saving bulbs have been generally well-developed and used intensively indoor illumination. However, compared to the newly developed light-emitting-diode (LED) lamps, these traditional lamps have the disadvantages of quick attenuation, high power consumption, high heat generation, short working life, high fragility, and being not recyclable. Thus, various LED package structures are created to replace the traditional lighting devices. However, the CRI of any LED package structure of the prior art is not good enough.

SUMMARY OF THE INVENTION

One particular aspect of the instant disclosure is to provide a light-mixing multichip package structure for increasing CRI.

One embodiment of the instant disclosure provides a light-mixing multichip package structure, comprising: a substrate unit, a light-emitting unit, a frame unit, and a package unit. The substrate unit includes at least one substrate body and at least two chip placing areas formed on the top surface of the substrate body. The light-emitting unit includes at least one first light-emitting module for generating red light and at least one second light-emitting module for generating blue light. The first light-emitting module includes a plurality of red light-emitting chips disposed on and electrically connected to one of the chip placing areas of the substrate unit, and the second light-emitting module includes a plurality of blue light-emitting chips disposed on and electrically connected to the other chip placing area of the substrate unit. The frame unit includes at least one first continuous colloid frame and at least one second continuous colloid frame surroundingly formed on the top surface of the substrate body by coating. The first continuous colloid frame surrounds the first light-emitting module to form at least one first colloid position limiting space on one of the chip placing areas of the substrate unit, and the second continuous colloid frame surrounds the second light-emitting module and the first continuous colloid frame to form at least one second colloid position limiting space on the other chip placing area of the substrate unit and between the first continuous colloid frame and the second continuous colloid frame. The package unit includes a transparent colloid body and a phosphor colloid body disposed on the top surface of the substrate body to respectively cover the first light-emitting module and the second light-emitting module. The transparent colloid body is limited in the first colloid position limiting space, and the phosphor colloid body is limited in the second colloid position limiting space.

Another embodiment of the instant disclosure provides a light-mixing multichip package structure, comprising: a substrate unit, a light-emitting unit, a frame unit, and a package unit. The substrate unit includes at least one substrate body and at least two chip placing areas formed on the top surface of the substrate body. The light-emitting unit includes at least one first light-emitting module for generating red light and at least one second light-emitting module for generating blue light. The first light-emitting module includes a plurality of red light-emitting chips disposed on and electrically connected to one of the chip placing areas of the substrate unit, and the second light-emitting module includes a plurality of blue light-emitting chips disposed on and electrically connected to the other chip placing area of the substrate unit. The frame unit includes at least one first continuous colloid frame and at least one second continuous colloid frame surroundingly formed on the top surface of the substrate body by coating. The first continuous colloid frame surrounds the second light-emitting module to form at least one first colloid position limiting space on one of the chip placing areas of the substrate unit, and the second continuous colloid frame surrounds the first light-emitting module and the first continuous colloid frame to form at least one second colloid position limiting space on the other chip placing area of the substrate unit and between the first continuous colloid frame and the second continuous colloid frame. The package unit includes a transparent colloid body and a phosphor colloid body disposed on the top surface of the substrate body to respectively cover the first light-emitting module and the second light-emitting module. The phosphor colloid body is limited in the first colloid position limiting space, and the transparent colloid body is limited in the second colloid position limiting space.

Another embodiment of the instant disclosure provides a light-mixing multichip package structure, comprising: a substrate unit, a light-emitting unit, a frame unit, and a package unit. The substrate unit includes at least one substrate body and at least two chip placing areas formed on the top surface of the substrate body. The light-emitting unit includes at least one first light-emitting module for generating red light and at least one second light-emitting module for generating blue light. The first light-emitting module includes a plurality of red light-emitting elements disposed on and electrically connected to one of the chip placing areas of the substrate unit, and the second light-emitting module includes a plurality of blue light-emitting chips disposed on and electrically connected to the other chip placing area of the substrate unit. The frame unit includes at least one first continuous colloid frame and at least one second continuous colloid frame surroundingly formed on the top surface of the substrate body by coating. The first continuous colloid frame surrounds the first light-emitting module, and the second continuous colloid frame surrounds the second light-emitting module and the first continuous colloid frame to form at least one colloid position limiting space on the other chip placing area of the substrate unit and between the first continuous colloid frame and the second continuous colloid frame. The package unit includes a phosphor colloid body disposed on the top surface of the substrate body to cover the second light-emitting module, and the phosphor colloid body is limited in the colloid position limiting space.

Another embodiment of the instant disclosure provides a light-mixing multichip package structure, comprising: a substrate unit, a light-emitting unit, a frame unit, and a package unit. The substrate unit including at least one substrate body and at least two chip placing areas formed on the top surface of the substrate body. The light-emitting unit includes at least one first light-emitting module for generating red light and at least one second light-emitting module for generating blue light. The first light-emitting module includes a plurality of red light-emitting elements disposed on and electrically connected to one of the chip placing areas of the substrate unit, and the second light-emitting module includes a plurality of blue light-emitting chips disposed on and electrically connected to the other chip placing area of the substrate unit. The frame unit includes at least one first continuous colloid frame and at least one second continuous colloid frame surroundingly formed on the top surface of the substrate body by coating. The first continuous colloid frame surrounds the second light-emitting module to form at least one colloid position limiting space on one of the chip placing areas of the substrate unit, and the second continuous colloid frame surrounds the first light-emitting module and the first continuous colloid frame. The package unit includes a phosphor colloid body disposed on the top surface of the substrate body to cover the second light-emitting module, and the phosphor colloid body is limited in the colloid position limiting space.

Hence, when the red light source generated by matching the red light-emitting chips and the transparent colloid body and the white light source generated by matching the blue light-emitting chips and the phosphor colloid body are mixed with each other, the color render index (CRI) of the light-mixing multichip package structure can be increased.

To further understand the techniques, means and effects the instant disclosure takes for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention that they be used for limiting the instant disclosure.

DETAILED DESCRIPTION OF THE PREFERRED EMBODIMENTS

First Embodiment

Figure 1A:
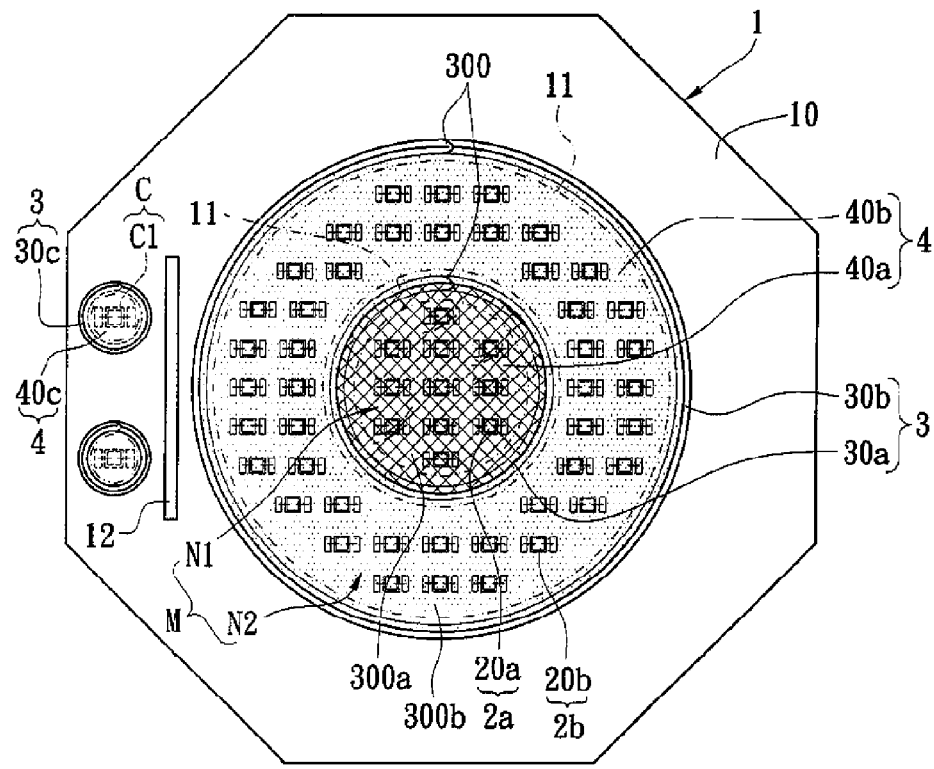
FIG. 1A shows a top, schematic view of the light-mixing multichip package structure according to the first embodiment of the instant disclosure.
Figure 1B:
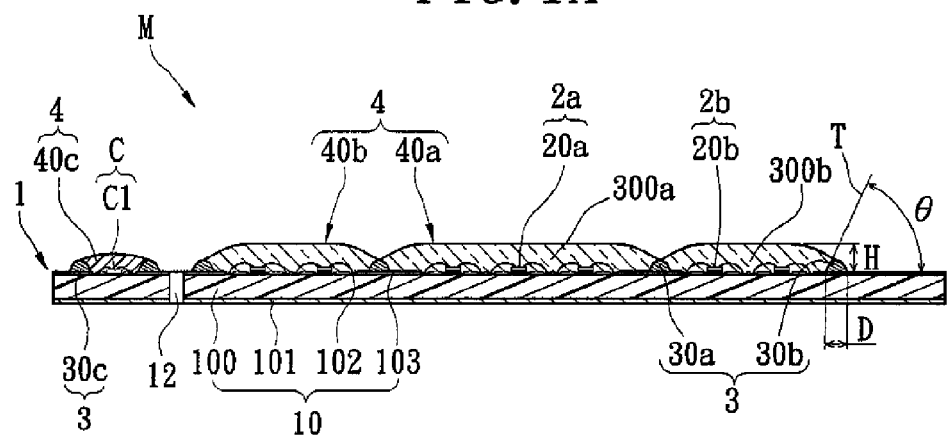
FIG. 1B shows a lateral, cross-sectional, schematic view of the light-mixing multichip package structure according to the first embodiment of the instant disclosure.

Referring to FIGS. 1A and 1B, where the first embodiment provides a light-mixing multichip package structure M, comprising: a substrate unit 1, a light-emitting unit, a frame unit 3, and a package unit 4.

The substrate unit 1 includes at least one substrate body 10 and at least two chip placing areas 11 formed on the top surface of the substrate body 10. For example, the substrate body 10 includes a circuit substrate 100, a heat dissipating layer 101 disposed on the bottom surface of the circuit substrate 100, a plurality of conductive pads 102 disposed on the top surface of the circuit substrate 100, and an insulative layer 103 disposed on the top surface of the circuit substrate 100 to expose the conductive pads 102. Hence, the heat dissipating efficiency of the circuit substrate 100 is increased by using the heat dissipating layer 101, and the insulative layer 103 is a solder mask for only exposing the conductive pads 102 in order to achieve local soldering.

The light-emitting unit includes at least one first light-emitting module 2a for generating red light and at least one second light-emitting module 2b for generating blue light. The first light-emitting module 2a includes a plurality of red light-emitting chips (bare dies) 20a disposed on and electrically connected to one of the chip placing areas 11 of the substrate unit 1, and the second light-emitting module 2b includes a plurality of blue light-emitting chips (bare dies) 20b disposed on and electrically connected to the other chip placing area 11 of the substrate unit 1. In other words, a designer can plan at least two predetermined chip placing areas 11 on the substrate body 10 in advance, thus the red light-emitting chips 20a and the blue light-emitting chips 20b can be respectively placed on the two chip placing areas 11 by wire bonding.

The frame unit 3 includes at least one first continuous colloid frame 30a (such as an annular resin frame) and at least one second continuous colloid frame 30b surroundingly formed on the top surface of the substrate body 10 by coating or other forming method. The first continuous colloid frame 30a surrounds the first light-emitting module 2a to form at least one first colloid position limiting space 300a on one of the chip placing areas 11 of the substrate unit 1, and the second continuous colloid frame 30b surrounds the second light-emitting module 2b and the first continuous colloid frame 30a to form at least one second colloid position limiting space 300b on the other chip placing area 11 of the substrate unit 1 and between the first continuous colloid frame 30a and the second continuous colloid frame 30b.

Moreover, the first continuous colloid frame 30a has a convex or concave junction portion 300, and the second continuous colloid frame 30b has a convex or concave junction portion 300. In other words, when the first continuous colloid frame 30a or the second continuous colloid frame 30b is going to finish by surroundingly coating, the convex or concave junction portion 300 is formed naturally on the first continuous colloid frame 30a or the second continuous colloid frame 30b. In addition, the first or second continuous colloid frame (30a or 30b) has an arc shape formed on the top surface thereof, the first or second continuous colloid frame (30a or 30b) has a radius tangent T and the angle θ of the radius tangent T relative to the top surface of the substrate body 10 may be between 40☐ and 50☐, the maximum height H of the first or second continuous colloid frame (30a or 30b) relative to the top surface of the substrate body 10 may be between 0.3 mm and 0.7 mm, the width D of the bottom side of the first or second continuous colloid frame (30a or 30b) may be between 1.5 mm and 3 mm, the thixotropic index of the first or second continuous colloid frame (30a or 30b) may be between 4 and 6, and the first or second continuous colloid frame (30a or 30b) may be formed by mixing inorganic additive with white thermohardening colloid.

The package unit 4 includes a transparent colloid body 40a and a phosphor colloid body 40b disposed on the top surface of the substrate body 10 to respectively cover the first light-emitting module 2a and the second light-emitting module 2b. The transparent colloid body 40a is limited in the first colloid position limiting space 300a, and the phosphor colloid body 40b is limited in the second colloid position limiting space 300b. In addition, the first continuous colloid frame 30a and the second continuous colloid frame 30b may be arranged to form a concentric circular shape. The second light-emitting module 2b is disposed between the first continuous colloid frame 30a and the second continuous colloid frame 30b, and the blue light-emitting chips 20b are disposed around the first continuous colloid frame 30a (as shown in FIG. 1A).

A first light-emitting structure N1 in the inner circle comprises the substrate body 10, the red light-emitting chips 20a, the first continuous colloid frame 30a and the transparent colloid body 40a. A second light-emitting structure N1 in the outer circle comprises the substrate body 10, the blue light-emitting chips 20b, the second continuous colloid frame 30b and the phosphor colloid body 40b. Moreover, the first light-emitting structure N1 and the second light-emitting structure N2 can share the same substrate unit 1 as shown in the first embodiment or use different substrate units. The first light-emitting structure N1 and the second light-emitting structure N2 are combined to form the light-mixing multichip package structure M.

Figure 1C:
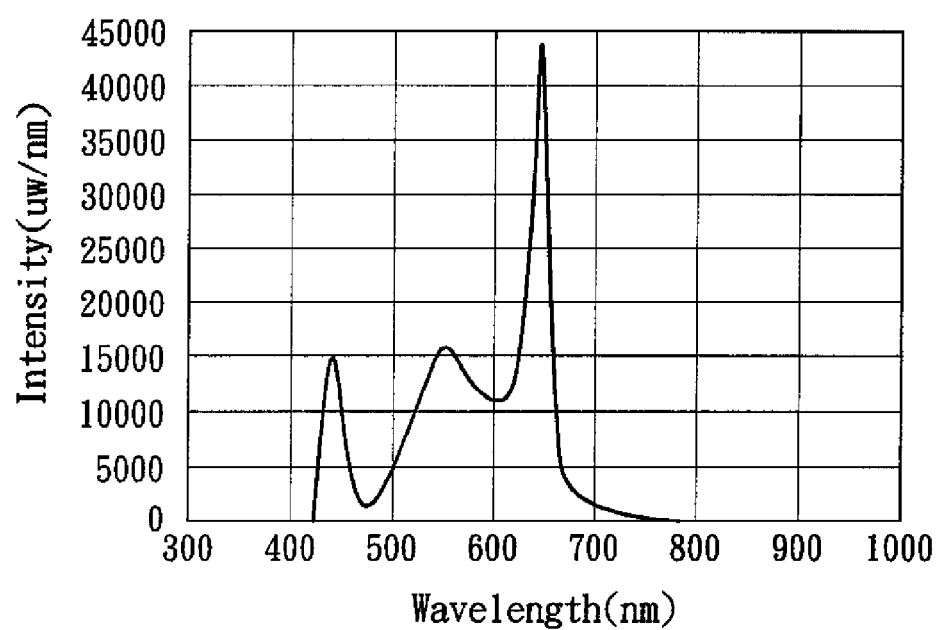
FIG. 1C shows a spectrogram of the light-mixing multichip package structure according to the first embodiment of the instant disclosure.

Furthermore, referring to the spectrogram of FIG. 1C, when the red light source generated by matching the red light-emitting chips 20a and the transparent colloid body 40a and the white light source generated by matching the blue light-emitting chips 20b and the phosphor colloid body 40b are mixed with each other, the color render index (such as the rendering average (Ra) and the deep red $R_9$) of the light-mixing multichip package structure M can be increased. For example, when the first embodiment of the instant disclosure provides a voltage of 24 (V) and an electric current of 1.25 milliampere (mA) for the light-mixing multichip package structure M, the relevant measurement results are shown in the following table:

| | |
|---|---|
| Luminous flux | 2872.629 (Lumen) |
| Light power | 8.266 (W) |
| Luminous efficiency | 95.251 (Lumen/W) |
| CIE x and CIE y | 0.4289 and 0.3814 |
| CIE u' and CIE v' | 0.2553 and 0.5109 |
| CCT | 2946.9 (K) |
| $R_9$ | 37.468 |
| Ra | 90.128 |

Moreover, the light-mixing multichip package structure M further comprises: a current-limiting unit C including at least two current-limiting chips C2 disposed on and electrically connected to the top surface of the substrate body 10 (such as by wire bonding) and separated from the second continuous colloid frame 30b by a predetermined distance. The frame unit 3 includes at least two third continuous colloid frames 30c surroundingly formed on the top surface of the substrate body 10 by coating to respectively surround the two current-limiting chips C1. The method of making the two third continuous colloid frames 30c is the same as that of making the first or second continuous colloid frame (30a, 30b). Of course, the two third continuous colloid frames 30c can be combined to form one third continuous colloid frame 30c for surrounding the two current-limiting chips C1 at the same time. In addition, the package unit 4 includes at least two opaque colloid bodies 40c disposed on the top surface of the substrate body 10 to respectively cover the two current-limiting chips C1 and be respectively surrounded by the two third continuous colloid frames 30c, thus the two opaque colloid bodies 40c can prevent the two current-limiting chips C1 from being damaged or affected by lighting of the red light-emitting chips 20a and the blue light-emitting chips 20b.

Furthermore, the substrate unit 1 includes at least one heat-insulating slot 12 passing through the substrate body 10, and the heat-insulating slot 12 can be formed between the light-emitting unit (the first light-emitting module 2a and the second light-emitting module 2b) and the current-limiting unit C or between the second continuous colloid frame 30b and the third continuous colloid frame 30c. Therefore, the heat transmitting path between the light-emitting unit and the current-limiting unit C can be effectively reduced by using the heat-insulating slot 12, thus the velocity of transmitting the heat generated by the current-limiting chip C1 to the light-emitting unit can be effectively decreased.

Figure 1D:
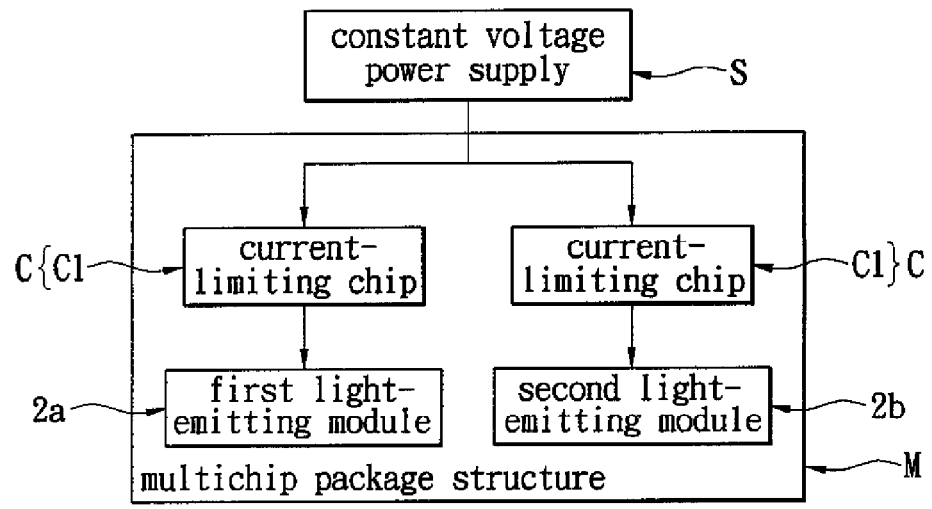
FIG. 1D shows a function block of the light-mixing multichip package structure according to the first embodiment of the instant disclosure.
Figure 1E:
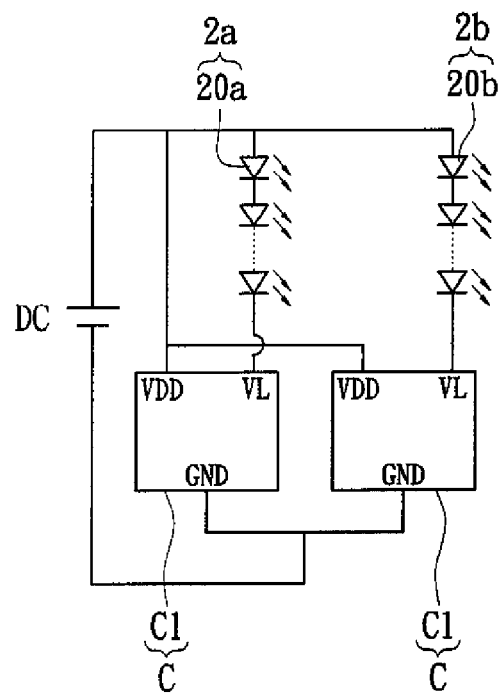
FIG. 1E shows a circuit diagram of using two current-limiting chips according to the first embodiment of the instant disclosure.

Referring to FIGS. 1D and 1E, the first light-emitting module 2a and the second light-emitting module 2b may be electrically connected to the substrate body 10 in parallel. The red light-emitting chips 20a and one of the two current-limiting chips C1 may be electrically connected with each other in series, and the blue light-emitting chips 20b and the other current-limiting chip C1 may be electrically connected with each other in series. In addition, the current-limiting chip C1 is electrically connected between the constant voltage power supply S and the first light-emitting module 2a and between the constant voltage power supply S and the second light-emitting module 2b, thus the light-emitting unit can obtain constant voltage from the constant voltage power supply S through the current-limiting chip C1.

Of courser, the red light-emitting chips 20a can be electrically connected with each other in parallel to form a parallel red LED chip group, the blue light-emitting chips 20b can be divided into a plurality of parallel blue LED chip groups, and the parallel red LED chip group and the parallel blue LED chip groups can be electrically connected with each other in series. In addition, the red light-emitting chips 20a can be lighted up simultaneously or sectionally, and the blue light-emitting chips 20b can be lighted up simultaneously or sectionally.

Second Embodiment

Figure 2:
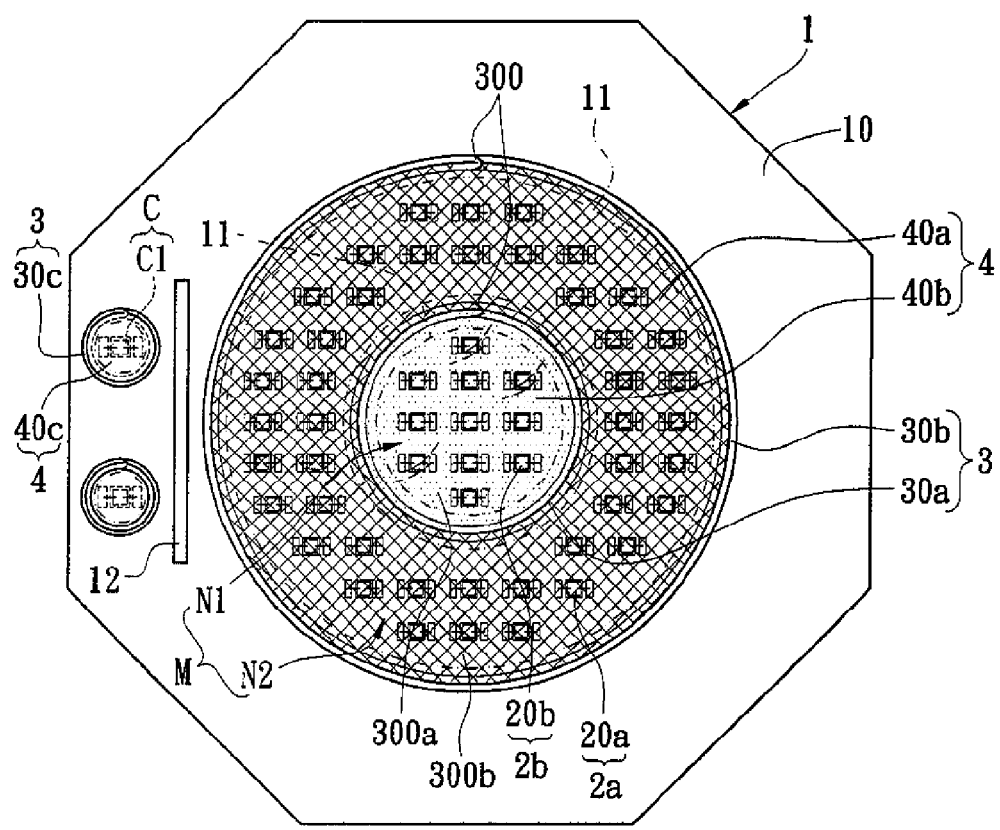
FIG. 2 shows a top, schematic view of the light-mixing multichip package structure according to the second embodiment of the instant disclosure.

Referring to FIG. 2, where the second embodiment provides a light-mixing multichip package structure M, comprising: a substrate unit 1, a light-emitting unit, a frame unit 3, and a package unit 4. Comparing FIG. 2 with FIG. 1, the difference between the second embodiment and the first embodiment is that: in the second embodiment, the two positions of the first light-emitting module 2a and the second light-emitting module 2b are exchanged, thus the first light-emitting module 2a is positioned on the outer circle of the light-mixing multichip package structure M and the second light-emitting module 2b is positioned on the inner circle of the light-mixing multichip package structure M. In other words, the first continuous colloid frame 30a surrounds the second light-emitting module 2b, the second continuous colloid frame 30b surrounds the first light-emitting module 2a and the first continuous colloid frame 30a, the first light-emitting module 2a is disposed between the first continuous colloid frame 30a and the second continuous colloid frame 30b, and the red light-emitting chips 20a are disposed around the first continuous colloid frame 30a. The phosphor colloid body 40b is limited in the first colloid position limiting space 300a, and the transparent colloid body 40a is limited in the second colloid position limiting space 300b.

Hence, the instant disclosure can selectively place the first light-emitting structure N1 with the red light-emitting chips 20a and the transparent colloid body 40a on the inner circle and the second light-emitting structure N2 with the blue light-emitting chips 20b and the phosphor colloid body 40b on the outer circle (as shown in the first embodiment) or place the first light-emitting structure N1 with the red light-emitting chips 20a and the transparent colloid body 40a on the outer circle and the second light-emitting structure N2 with the blue light-emitting chips 20b and the phosphor colloid body 40b on the inner circle (as shown in the second embodiment), according to different requirements.

Third Embodiment

Figure 3:
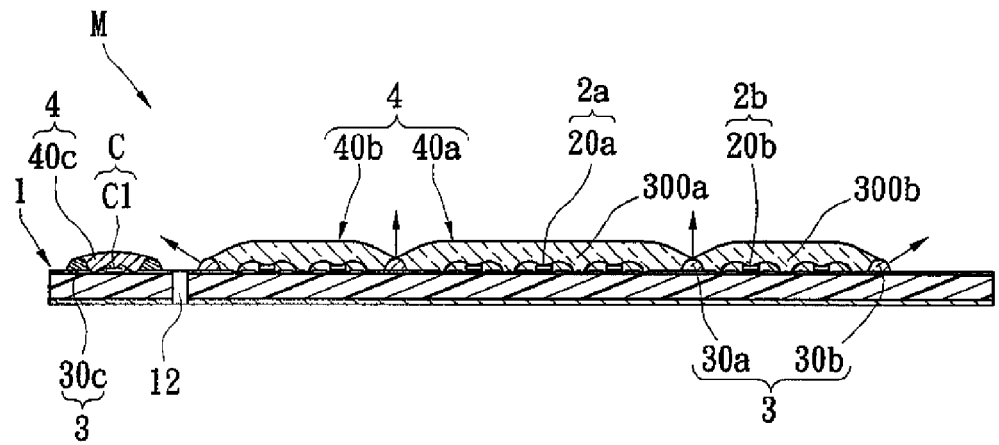
FIG. 3 shows a lateral, cross-sectional, schematic view of the light-mixing multichip package structure according to the third embodiment of the instant disclosure.

Referring to FIG. 3, where the third embodiment provides a light-mixing multichip package structure M, comprising: a substrate unit 1, a light-emitting unit, a frame unit 3, and a package unit 4. The difference between the third embodiment and the first embodiment is that: in the third embodiment, the first continuous colloid frame 30a and the second continuous colloid frame 30b can be one of a transparent colloid body or phosphor colloid body according to different requirements. For example, phosphor powders can be selectively added into the first continuous colloid frame 30a and the second continuous colloid frame 30b according to different requirements in order to decrease dark bands generated between the transparent colloid body 40a and the phosphor colloid body 40b and increase light projecting efficiency (as the direction of arrows shown in FIG. 3) between the transparent colloid body 40a and the phosphor colloid body 40b.

Fourth Embodiment

Figure 4:
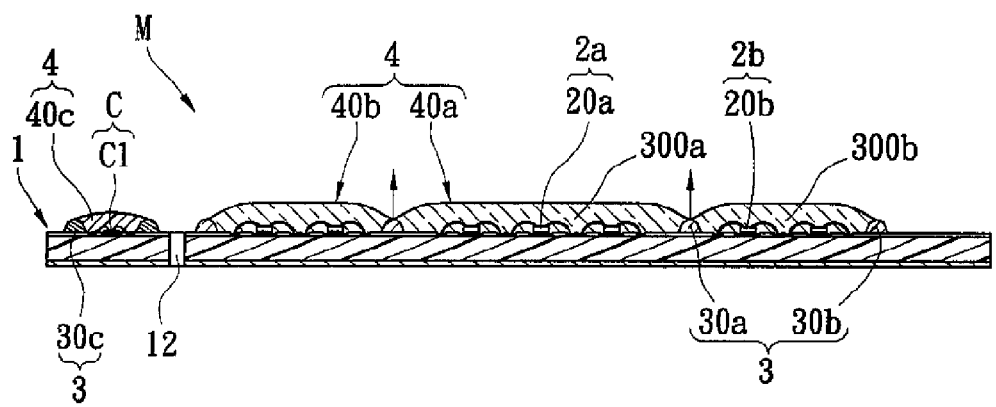
FIG. 4 shows a lateral, cross-sectional, schematic view of the light-mixing multichip package structure according to the fourth embodiment of the instant disclosure.

Referring to FIG. 4, where the fourth embodiment provides a light-mixing multichip package structure M, comprising: a substrate unit 1, a light-emitting unit, a frame unit 3, and a package unit 4. The difference between the fourth embodiment and the first embodiment is that: in the fourth embodiment, the first continuous colloid frame 30a can be a transparent colloid body or a phosphor colloid body, and the second continuous colloid frame 30b can be a reflective colloid body. For example, phosphor powders can be selectively added into the first continuous colloid frame 30a according to different requirements in order to decrease dark bands generated between the transparent colloid body 40a and the phosphor colloid body 40b and increase light projecting efficiency (as the direction of arrows shown in FIG. 3) between the transparent colloid body 40a and the phosphor colloid body 40b. In addition, light beams generated by the light-mixing multichip package structure M can be condensed by the second continuous colloid frame 30b.

Fifth Embodiment

Figure 5:
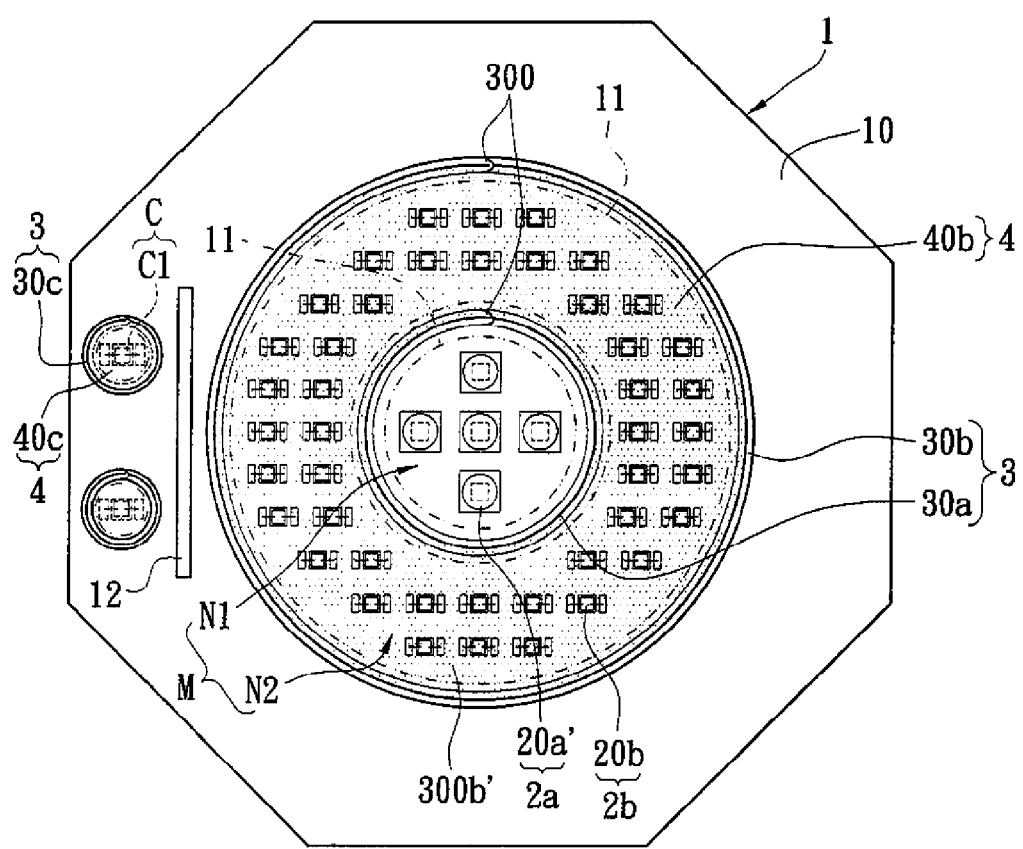
FIG. 5 shows a top, schematic view of the light-mixing multichip package structure according to the fifth embodiment of the instant disclosure.

Referring to FIG. 5, where the fifth embodiment provides a light-mixing multichip package structure M, comprising: a substrate unit 1, a light-emitting unit, a frame unit 3, and a package unit 4. The substrate unit 1 includes at least one substrate body 10 and at least two chip placing areas 11 formed on the top surface of the substrate body 10. The light-emitting unit includes at least one first light-emitting module 2a for generating red light and at least one second light-emitting module 2b for generating blue light. The first light-emitting module 2a includes a plurality of red light-emitting elements 20a' disposed on and electrically connected to one of the chip placing areas 11 of the substrate unit 1 (such as each red light-emitting element 20a' has been packaged to form an red LED package component electrically connected to the substrate unit 1 by SMT), and the second light-emitting module 2b includes a plurality of blue light-emitting chips 20b disposed on and electrically connected to the other chip placing area 11 of the substrate unit 1. The frame unit 3 includes at least one first continuous colloid frame 30a and at least one second continuous colloid frame 30b surroundingly formed on the top surface of the substrate body 10 by coating. The first continuous colloid frame 30a surrounds the first light-emitting module 2a, and the second continuous colloid frame 30b surrounds the second light-emitting module 2b and the first continuous colloid frame 30a to form at least one colloid position limiting space 300b' on the other chip placing area 11 of the substrate unit 1 and between the first continuous colloid frame 30a and the second continuous colloid frame 30b. The first continuous colloid frame 30a has a convex or concave junction portion 300, and the second continuous colloid frame 30b has a convex or concave junction portion 300. The package unit 4 includes a phosphor colloid body 40b disposed on the top surface of the substrate body 10 to cover the second light-emitting module 2b, and the phosphor colloid body 40b is limited in the colloid position limiting space 300b'.

Sixth Embodiment

Figure 6:
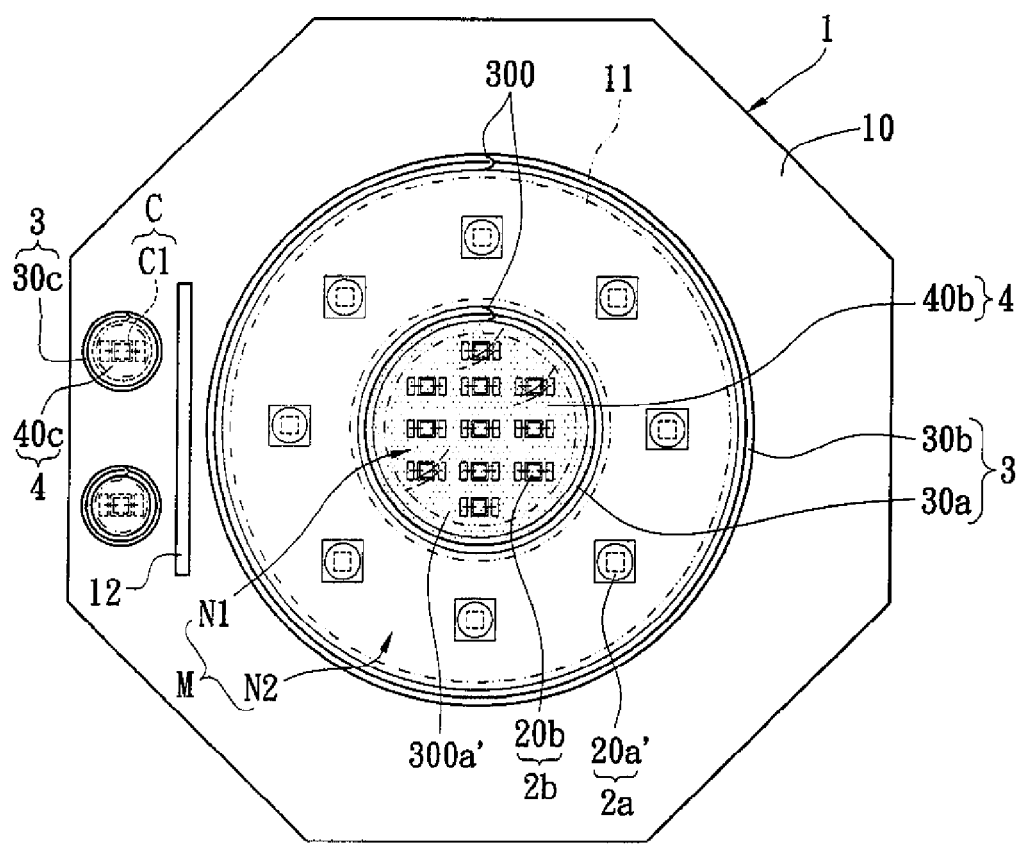
FIG. 6 shows a top, schematic view of the light-mixing multichip package structure according to the sixth embodiment of the instant disclosure.

Referring to FIG. 6, where the sixth embodiment provides a light-mixing multichip package structure M, comprising: a substrate unit 1, a light-emitting unit, a frame unit 3, and a package unit 4. The substrate unit 1 includes at least one substrate body 10 and at least two chip placing areas 11 formed on the top surface of the substrate body 10. The light-emitting unit includes at least one first light-emitting module 2a for generating red light and at least one second light-emitting module 2b for generating blue light. The first light-emitting module 2a includes a plurality of red light-emitting elements 20a' disposed on and electrically connected to one of the chip placing areas 11 of the substrate unit 1 (such as each red light-emitting element 20a' has been packaged to form an red LED package component electrically connected to the substrate unit 1 by SMT), and the second light-emitting module 2b includes a plurality of blue light-emitting chips 20b disposed on and electrically connected to the other chip placing area 11 of the substrate unit 1. The frame unit 3 includes at least one first continuous colloid frame 30a and at least one second continuous colloid frame 30b surroundingly formed on the top surface of the substrate body 10 by coating. The first continuous colloid frame 30a surrounds the second light-emitting module 2b to form at least one colloid position limiting space 300a' on one of the chip placing areas 11 of the substrate unit 1, and the second continuous colloid frame 30b surrounds the first light-emitting module 2a and the first continuous colloid frame 30a. The package unit 4 includes a phosphor colloid body 40b disposed on the top surface of the substrate body 10 to cover the second light-emitting module 2b, and the phosphor colloid body 40b is limited in the colloid position limiting space 300a'.

From First to Sixth Embodiments

Figure 7:
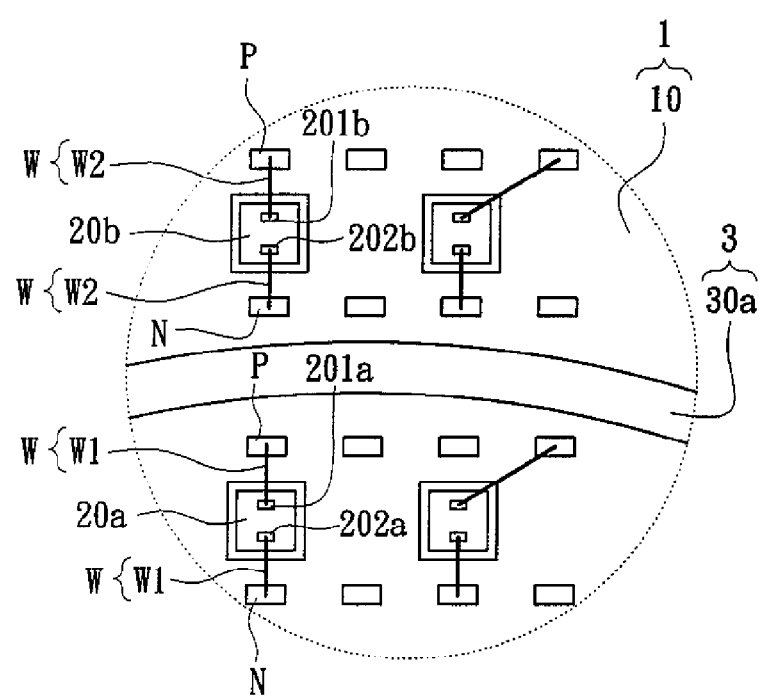
FIG. 7 shows a partial, top, schematic view of using a plurality of standby pads according to the instant disclosure.

Referring to FIG. 7, in the first to the sixth embodiments, the substrate unit 1 includes a plurality of positive pads P disposed on the top surface of the substrate body 10 and a plurality of negative pads N disposed on the top surface of the substrate body 10. Each red light-emitting chip 20a has a positive electrode 201a and a negative electrode 202a, the positive electrode 201a of each red light-emitting chip 20a corresponds to at least two of the positive pads P, and the negative electrode 202a of each red light-emitting chip 20a corresponds to at least two of the negative pads N. Each blue light-emitting chip 20b has a positive electrode 201b and a negative electrode 202b, the positive electrode 201b of each blue light-emitting chip 20b corresponds to at least two of the positive pads P, and the negative electrode 202b of each blue light-emitting chip 20b corresponds to at least two of the negative pads N.

Moreover, the light-mixing multichip package structure M further comprising: a conductive wire unit W including a plurality of first conductive wires W1 and a plurality of second conductive wires W2. The positive electrode 201a of each red light-emitting chip 20a is electrically connected with one of the two corresponding positive pads P by the first conductive wire W1 (the other corresponding positive pad P is a standby positive pad), and the negative electrode 202a of each red light-emitting chip 20a is electrically connected with one of the two corresponding negative pads N by the first conductive wire W1 (the other corresponding negative pad N is a standby negative pad). The positive electrode 201b of each blue light-emitting chip 20b is electrically connected with one of the two corresponding positive pads P by the second conductive wire W2, and the negative electrode 202b of each blue light-emitting chip 20b is electrically connected with one of the two corresponding negative pads N by the second conductive wire W2.

Therefore, using the red light-emitting chip 20a as an example, when a first end of the first conductive wire W1 does not correctly connect with first one of the two positive pads P or the two negative pads N (it means that the first end of the first conductive wire W1 does not electrically connect with the first one of the two positive pads P or the two negative pads N (such as floating solder)), the manufacturer can use the same first end of the first conductive wire W1 to connect to another one of the two positive pads P or the two negative pads N without cleaning solder splash on the surface of the first one of the two positive pads P or the two negative pads N, in order to decrease wire-bonding time (increase wire-bonding efficiency) and increase wire-bonding yield.

Figure 8A:
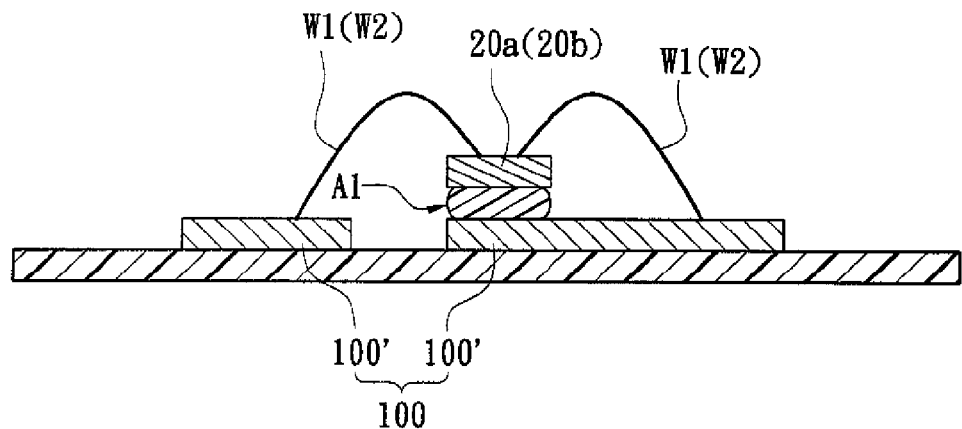
FIG. 8A shows a partial, lateral, schematic view of using another circuit substrate according to the instant disclosure.

Referring to FIG. 8A, in the first to the sixth embodiments, the circuit substrate 100 includes two electrode layers 100' as a positive electrode and a negative electrode. Each red light-emitting chip 20a can be fixed on one of the electrode layers 100' by an adhesive body A1, and each red light-emitting chip 20a has a positive electrode (not shown) and a negative electrode (not shown) on the top surface thereof to respectively connect with the two electrode layers 100' through two first conductive wires W1. In addition, each blue light-emitting chip 20b can be also fixed on one of the electrode layers 100' by an adhesive body A1, and each blue light-emitting chip 20b has a positive electrode (not shown) and a negative electrode (not shown) on the top surface thereof to respectively connect with the two electrode layers 100' through two second conductive wires W2.

Figure 8B:
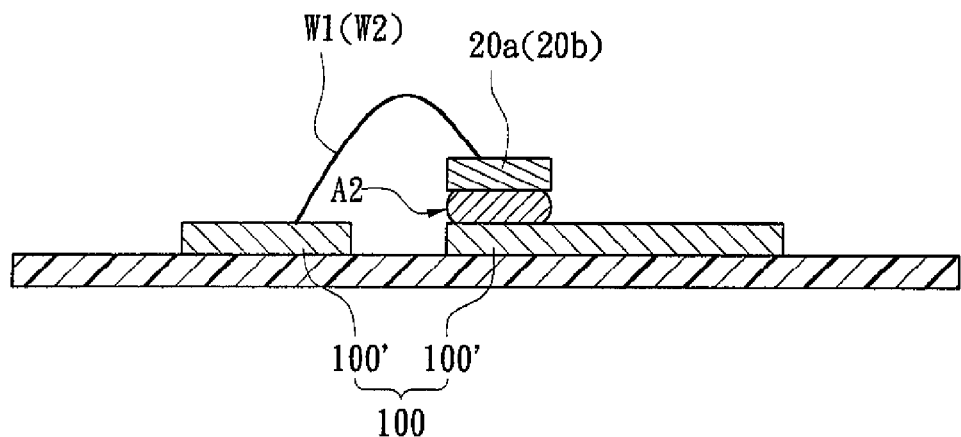
FIG. 8B shows a partial, lateral, schematic view of using further another circuit substrate according to the instant disclosure.

Referring to FIG. 8B, in the first to the sixth embodiments, the circuit substrate 100 includes two electrode layers 100' as a positive electrode and a negative electrode. Each red light-emitting chip 20a can be fixed on the first electrode layer 100' by an adhesive body A1, each red light-emitting chip 20a has one electrode (not shown) on the bottom surface thereof to electrically contact the first electrode layers 100' through the adhesive body A1, and each red light-emitting chip 20a has another electrode (not shown) on the top surface thereof to electrically connect with the second electrode layer 100' through the first conductive wire W1. In addition, Each blue light-emitting chip 20b can be also fixed on the first electrode layer 100' by an adhesive body A1, each blue light-emitting chip 20b has one electrode (not shown) on the bottom surface thereof to electrically contact the first electrode layers 100' through the adhesive body A1, and each blue light-emitting chip 20b has another electrode (not shown) on the top surface thereof to electrically connect with the second electrode layer 100' through the second conductive wire W2.

In conclusion, when the red light source generated by matching the red light-emitting chips and the transparent colloid body and the white light source generated by matching the blue light-emitting chips and the phosphor colloid body are mixed with each other, the color render index (CRI) of the light-mixing multichip package structure can be increased.

Moreover, the first, the second and the third continuous colloid frames (such as an annular white colloid frame) of any shapes can be formed by coating in the instant disclosure. In addition, the position of the light-permitting package colloid body (such as the transparent, the phosphor and the opaque resin or gel) can be limited in the colloid position limiting space by using the continuous colloid frame, and the shape of the light-permitting package colloid body can be adjusted by using the continuous colloid frame. Therefore, the instant disclosure can increase the light-emitting efficiency of the light-emitting chips and control the light projecting angle of the light-emitting chips. In other words, the light-permitting package colloid body is limited in the colloid position limiting space by using the continuous colloid frame, thus the usage quantity of the light-permitting package colloid body can be controlled by the manufacture. In addition, the surface shape and the height of the light-permitting package colloid body can be adjusted by controlling the usage quantity of the light-permitting package colloid body, thus the light projecting angles of the light mixing source can be adjusted. Moreover, the light beams generated by the light-emitting chips can be reflected by an inner wall of the continuous colloid frame, thus the light-emitting efficiency of the instant disclosure can be effectively increased.

Furthermore, the positive electrode and the negative electrode of each light-emitting chip respectively correspond to at least two of the positive pads and at least two of the negative pads, thus the positive electrode of each light-emitting chip has at least one standby positive pad and the negative electrode of each light-emitting chip has at least one standby negative pad.

In addition, the light-emitting chips and the two current-limiting chips are electrically connected to the same substrate body, thus the light-mixing multichip package structure can use the constant voltage power supply as power supply source.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A light-mixing multichip package structure, comprising:
   a substrate unit including at least one substrate body and at least two chip placing areas formed on the top surface of the substrate body;
   a light-emitting unit including at least one first light-emitting module for generating red light and at least one second light-emitting module for generating blue light, wherein the first light-emitting module includes a plurality of red light-emitting chips disposed on and electrically connected to one of the chip placing areas of the substrate unit, and the second light-emitting module includes a plurality of blue light-emitting chips disposed on and electrically connected to the other chip placing area of the substrate unit;
   a frame unit including at least one first continuous colloid frame and at least one second continuous colloid frame surroundingly formed on the top surface of the substrate body by coating, wherein the first continuous colloid frame surrounds the first light-emitting module to form at least one first colloid position limiting space on one of the chip placing areas of the substrate unit, and the second continuous colloid frame surrounds the second light-emitting module and the first continuous colloid frame to form at least one second colloid position limiting space on the other chip placing area of the substrate unit and between the first continuous colloid frame and the second continuous colloid frame; and
   a package unit including a transparent colloid body and a phosphor colloid body disposed on the top surface of the substrate body to respectively cover the first light-emitting module and the second light-emitting module, wherein the transparent colloid body is limited in the first colloid position limiting space, and the phosphor colloid body is limited in the second colloid position limiting space.

2. The light-mixing multichip package structure of claim 1, wherein the first continuous colloid frame has a convex junction portion or a concave junction portion, and the second continuous colloid frame has a convex junction portion or a concave junction portion.

3. The light-mixing multichip package structure of claim 1, wherein the first continuous colloid frame and the second continuous colloid frame are arranged to form a concentric circular shape, the second light-emitting module is disposed between the first continuous colloid frame and the second continuous colloid frame, and the blue light-emitting chips are disposed around the first continuous colloid frame.

4. The light-mixing multichip package structure of claim 1, wherein the first continuous colloid frame is a transparent colloid body or a phosphor colloid body, and the second continuous colloid frame is a transparent colloid body, a phosphor colloid body, or a reflective colloid body.

5. The light-mixing multichip package structure of claim 1, wherein the first continuous colloid frame has an arc shape formed on the top surface thereof, the first continuous colloid frame has a radius tangent and the angle of the radius tangent relative to the top surface of the substrate body is between 40□ and 50□, the maximum height of the first continuous colloid frame relative to the top surface of the substrate body is between 0.3 mm and 0.7 mm, the width of the bottom side of the first continuous colloid frame is between 1.5 mm and 3 mm, the thixotropic index of the first continuous colloid frame is between 4 and 6, and the first continuous colloid frame is formed by mixing inorganic additive with white thermohardening colloid, wherein the second continuous colloid frame has an arc shape formed on the top surface thereof, the second continuous colloid frame has a radius tangent and the angle of the radius tangent relative to the top surface of the substrate body is between 40□ and 50□, the maximum height of the second continuous colloid frame relative to the top surface of the substrate body is between 0.3 mm and 0.7 mm, the width of the bottom side of the second continuous colloid frame is between 1.5 mm and 3 mm, the thixotropic index of the second continuous colloid frame is between 4 and 6, and the second continuous colloid frame is formed by mixing inorganic additive with white thermohardening colloid 6. The light-mixing multichip package structure of claim 1, wherein the substrate unit includes a plurality of positive pads disposed on the top surface of the substrate body and a plurality of negative pads disposed on the top surface of the substrate body, wherein each red light-emitting chip has a positive electrode and a negative electrode, the positive electrode of each red light-emitting chip corresponds to at least two of the positive pads, and the negative electrode of each red light-emitting chip corresponds to at least two of the negative pads, wherein each blue light-emitting chip has a positive electrode and a negative electrode, the positive electrode of each blue light-emitting chip corresponds to at least two of the positive pads, and the negative electrode of each blue light-emitting chip corresponds to at least two of the negative pads.

7. The light-mixing multichip package structure of claim 6, further comprising a conductive wire unit including a plurality of first conductive wires and a plurality of second conductive wires, wherein the positive electrode of each red light-emitting chip is electrically connected with one of the two corresponding positive pads by the first conductive wire, and the negative electrode of each red light-emitting chip is electrically connected with one of the two corresponding negative pads by the first conductive wire, wherein the positive electrode of each blue light-emitting chip is electrically connected with one of the two corresponding positive pads by the second conductive wire, and the negative electrode of each blue light-emitting chip is electrically connected with one of the two corresponding negative pads by the second conductive wire.

8. The light-mixing multichip package structure of claim 1, further comprising: a current-limiting unit including at least two current-limiting chips disposed on and electrically connected to the top surface of the substrate body and separated from the second continuous colloid frame by a predetermined distance, wherein the frame unit includes at least two third continuous colloid frames surroundingly formed on the top surface of the substrate body by coating to respectively surround the two current-limiting chips, and the package unit includes at least two opaque colloid bodies disposed on the top surface of the substrate body to respectively cover the two current-limiting chips and be respectively surrounded by the two third continuous colloid frames, wherein the first light-emitting module and the second light-emitting module are electrically connected to the substrate body in parallel, the red light-emitting chips and one of the two current-limiting chips are electrically connected with each other in series, and the blue light-emitting chips and the other current-limiting chip are electrically connected with each other in series.

9. The light-mixing multichip package structure of claim 8, wherein the substrate unit includes at least one heat-insulating slot passing through the substrate body, and the heat-insulating slot is formed between the light-emitting unit and the current-limiting unit or between the second continuous colloid frame and the third continuous colloid frame.

10. A light-mixing multichip package structure, comprising:
   a substrate unit including at least one substrate body and at least two chip placing areas formed on the top surface of the substrate body;
   a light-emitting unit including at least one first light-emitting module for generating red light and at least one second light-emitting module for generating blue light, wherein the first light-emitting module includes a plurality of red light-emitting chips disposed on and electrically connected to one of the chip placing areas of the substrate unit, and the second light-emitting module includes a plurality of blue light-emitting chips disposed on and electrically connected to the other chip placing area of the substrate unit;
   a frame unit including at least one first continuous colloid frame and at least one second continuous colloid frame surroundingly formed on the top surface of the substrate body by coating, wherein the first continuous colloid frame surrounds the second light-emitting module to form at least one first colloid position limiting space on one of the chip placing areas of the substrate unit, and the second continuous colloid frame surrounds the first light-emitting module and the first continuous colloid frame to form at least one second colloid position limiting space on the other chip placing area of the substrate unit and between the first continuous colloid frame and the second continuous colloid frame; and
   a package unit including a transparent colloid body and a phosphor colloid body disposed on the top surface of the substrate body to respectively cover the first light-emitting module and the second light-emitting module, wherein the phosphor colloid body is limited in the first colloid position limiting space, and the transparent colloid body is limited in the second colloid position limiting space.

11. The light-mixing multichip package structure of claim 10, wherein the first continuous colloid frame has a convex junction portion or a concave junction portion, and the second continuous colloid frame has a convex junction portion or a concave junction portion.

12. The light-mixing multichip package structure of claim 10, wherein the first continuous colloid frame and the second continuous colloid frame are arranged to form a concentric circular shape, the first light-emitting module is disposed between the first continuous colloid frame and the second continuous colloid frame, and the red light-emitting chips are disposed around the first continuous colloid frame.

13. The light-mixing multichip package structure of claim 10, wherein the first continuous colloid frame is a transparent colloid body or a phosphor colloid body, and the second continuous colloid frame is a transparent colloid body, a phosphor colloid body, or a reflective colloid body.

14. The light-mixing multichip package structure of claim 10, wherein the first continuous colloid frame has an arc shape formed on the top surface thereof, the first continuous colloid frame has a radius tangent and the angle of the radius tangent relative to the top surface of the substrate body is between 4□ and 50□, the maximum height of the first continuous colloid frame relative to the top surface of the substrate body is between 0.3 mm and 0.7 mm, the width of the bottom side of the first continuous colloid frame is between 1.5 mm and 3 mm, the thixotropic index of the first continuous colloid frame is between 4 and 6, and the first continuous colloid frame is formed by mixing inorganic additive with white thermohardening colloid, wherein the second continuous colloid frame has an arc shape formed on the top surface thereof, the second continuous colloid frame has a radius tangent and the angle of the radius tangent relative to the top surface of the substrate body is between 40□ and 50□, the maximum height of the second continuous colloid frame relative to the top surface of the substrate body is between 0.3 mm and 0.7 mm, the width of the bottom side of the second continuous colloid frame is between 1.5 mm and 3 mm, the thixotropic index of the second continuous colloid frame is between 4 and 6, and the second continuous colloid frame is formed by mixing inorganic additive with white thermohardening colloid.

15. The light-mixing multichip package structure of claim 10, wherein the substrate unit includes a plurality of positive pads disposed on the top surface of the substrate body and a plurality of negative pads disposed on the top surface of the substrate body, wherein each red light-emitting chip has a positive electrode and a negative electrode, the positive electrode of each red light-emitting chip corresponds to at least two of the positive pads, and the negative electrode of each red light-emitting chip corresponds to at least two of the negative pads, wherein each blue light-emitting chip has a positive electrode and a negative electrode, the positive electrode of each blue light-emitting chip corresponds to at least two of the positive pads, and the negative electrode of each blue light-emitting chip corresponds to at least two of the negative pads.

16. The light-mixing multichip package structure of claim 10, further comprising: a current-limiting unit including at least two current-limiting chips disposed on and electrically connected to the top surface of the substrate body and separated from the second continuous colloid frame by a predetermined distance, wherein the frame unit includes at least two third continuous colloid frames surroundingly formed on the top surface of the substrate body by coating to respectively surround the two current-limiting chips, and the package unit includes at least two opaque colloid bodies disposed on the top surface of the substrate body to respectively cover the two current-limiting chips and be respectively surrounded by the two third continuous colloid frames, wherein the first light-emitting module and the second light-emitting module are electrically connected to the substrate body in parallel, the red light-emitting chips and one of the two current-limiting chips are electrically connected with each other in series, and the blue light-emitting chips and the other current-limiting chip are electrically connected with each other in series.

17. The light-mixing multichip package structure of claim 16, wherein the substrate unit includes at least one heat-insulating slot passing through the substrate body, and the heat-insulating slot is formed between the light-emitting unit and the current-limiting unit or between the second continuous colloid frame and the third continuous colloid frame.

18. A light-mixing multichip package structure, comprising:
   a substrate unit including at least one substrate body and at least two chip placing areas formed on the top surface of the substrate body;
   a light-emitting unit including at least one first light-emitting module for generating red light and at least one second light-emitting module for generating blue light, wherein the first light-emitting module includes a plurality of red light-emitting elements disposed on and electrically connected to one of the chip placing areas of the substrate unit, and the second light-emitting module includes a plurality of blue light-emitting chips disposed on and electrically connected to the other chip placing area of the substrate unit;

a frame unit including at least one first continuous colloid frame and at least one second continuous colloid frame surroundingly formed on the top surface of the substrate body by coating, wherein the first continuous colloid frame surrounds the first light-emitting module, and the second continuous colloid frame surrounds the second light-emitting module and the first continuous colloid frame to form at least one colloid position limiting space on the other chip placing area of the substrate unit and between the first continuous colloid frame and the second continuous colloid frame; and a package unit including a phosphor colloid body disposed on the top surface of the substrate body to cover the second light-emitting module, wherein the phosphor colloid body is limited in the colloid position limiting space.

19. The light-mixing multichip package structure of claim 18, wherein the first continuous colloid frame has a convex junction portion or a concave junction portion, and the second continuous colloid frame has a convex junction portion or a concave junction portion.

20. A light-mixing multichip package structure, comprising:

a substrate unit including at least one substrate body and at least two chip placing areas formed on the top surface of the substrate body;

a light-emitting unit including at least one first light-emitting module for generating red light and at least one second light-emitting module for generating blue light, wherein the first light-emitting module includes a plurality of red light-emitting elements disposed on and electrically connected to one of the chip placing areas of the substrate unit, and the second light-emitting module includes a plurality of blue light-emitting chips disposed on and electrically connected to the other chip placing area of the substrate unit;

a frame unit including at least one first continuous colloid frame and at least one second continuous colloid frame surroundingly formed on the top surface of the substrate body by coating, wherein the first continuous colloid frame surrounds the second light-emitting module to form at least one colloid position limiting space on one of the chip placing areas of the substrate unit, and the second continuous colloid frame surrounds the first light-emitting module and the first continuous colloid frame; and a package unit including a phosphor colloid body disposed on the top surface of the substrate body to cover the second light-emitting module, wherein the phosphor colloid body is limited in the colloid position limiting space.

* * * * *